(12) United States Patent
Klein et al.

(10) Patent No.: US 7,913,140 B2
(45) Date of Patent: Mar. 22, 2011

(54) METHOD AND DEVICE TO DETECT FAILURE OF STATIC CONTROL SIGNALS

(75) Inventors: Matthias Klein, Boeblingen (DE);
Andreas Wagner, Boeblingen (DE);
Gerhard Zilles, Jettingen (DE);
Manfred H Walz, Boeblingen (DE);
Thomas Buechner, Weil im Schonbuch (DE)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 12/174,621

(22) Filed: Jul. 16, 2008

(65) Prior Publication Data
US 2010/0017667 A1    Jan. 21, 2010

(51) Int. Cl.
*G01R 31/28* (2006.01)
(52) U.S. Cl. ....................................................... 714/732
(58) Field of Classification Search .................... None
See application file for complete search history.

(56) References Cited

U.S. PATENT DOCUMENTS

| 5,636,226 | A | 6/1997 | Truong et al. |
| 5,940,413 | A | 8/1999 | Kim et al. |
| 7,171,592 | B2 * | 1/2007 | Togashi et al. ................... 714/54 |
| 2002/0105386 | A1 * | 8/2002 | Shastri ............................. 331/11 |
| 2003/0184459 | A1 * | 10/2003 | Engl .............................. 341/120 |
| 2007/0011535 | A1 * | 1/2007 | Anzou et al. ................... 714/733 |

FOREIGN PATENT DOCUMENTS

JP            06274360        9/1994

OTHER PUBLICATIONS

Cohen, A et al., "Manufacturing Test Mode for the Peripheral Interconnect Bus", Aug. 1995, IBM TDB, v38 n8, pp. 57-60.

* cited by examiner

*Primary Examiner* — Robert Beausoliel
*Assistant Examiner* — Guerrier Merant
(74) *Attorney, Agent, or Firm* — PRTSI, Inc.; Martin D. Moynihan

(57) ABSTRACT

A method and circuits for monitoring and detecting an error in the static pervasive signals applied to input/output pins of an integrated circuit during functional operation of the integrated circuit. The method and circuits provide a signal signature of each of one or more groups of the static pervasive signals and then monitoring the signal signature for any change of logic level.

1 Claim, 3 Drawing Sheets

Device Function Overview – General

METHOD AND DEVICE TO DETECT FAILURE OF STATIC CONTROL SIGNALS

FIELD OF INVENTION

Monitoring and detecting fails of static signals on I/O pins of a semiconductor circuit

BACKGROUND

A large number of I/O pins of a computer chip are used to provide signals for the chip's maintenance and infrastructure and are not used for functional use or for traffic flow. Most of these signals either specify a static setting or are used in functions which are only needed in the initialization of the chip. During functional operation mode of the chip, all these signals are supposed to remain at a static value. However, sometimes, the development of shorts and opens or other fail mechanisms such as the injection of noise by induction will cause the signal integrity to be compromised despite all prior verification and signal noise analysis.

Current chip implementations do not provide a mechanism to check the integrity of these signals, so that a failure or a voltage level change of any of these signals at a point in time during functional operation leads to unexpected and highly undesired effects. Due to the nature of these control signals, it is usually difficult or impossible to track the pattern of the resulting errors down to the causing failing signal, which might, for example, control a phase locked loop (PLL) or a part of a clock tree.

SUMMARY

The invention comprises a method and apparatus for monitoring and detecting errors occurring on the input/output (I/O) pins of an integrated circuit.

An exemplary embodiment of the invention presents a method for detecting failures on static signals applied to I/O pins of an integrated circuit. The method comprises the grouping of the static signals into one or more groups, building a signal signature for each of the one or more groups, feeding each of the signal signatures of the one or more groups into a store element and comparing each of the signal signatures for the one or more groups with the output of the store element into which it is fed. If there is an error such that the static signal is changed, a signature mismatch for each of the signal signatures that differs from the output of the store element into which it is fed is created and presented as an error indicator output.

An exemplary embodiment of a logical implementation of the present invention is represented for each group of I/O pins as follows. The group of two or more I/O pins has each pin feeding its signal into a separate receiver circuit. The output of each receiver, in turn, is fed into a signal signature circuit. An example of such a signal signature circuit would be an exclusive or (XOR) circuit. The single output of the signal signature circuit is then fed into a storage element (SE). An example of a storage element is a latch circuit. The output of the storage element and the output of the signal signature circuit are fed into a compare circuit. The results at the output of the compare circuit are then fed into capture logic where it is retained as an error or non-error indicator.

DETAILED DESCRIPTION OF INVENTION

Figure 1:
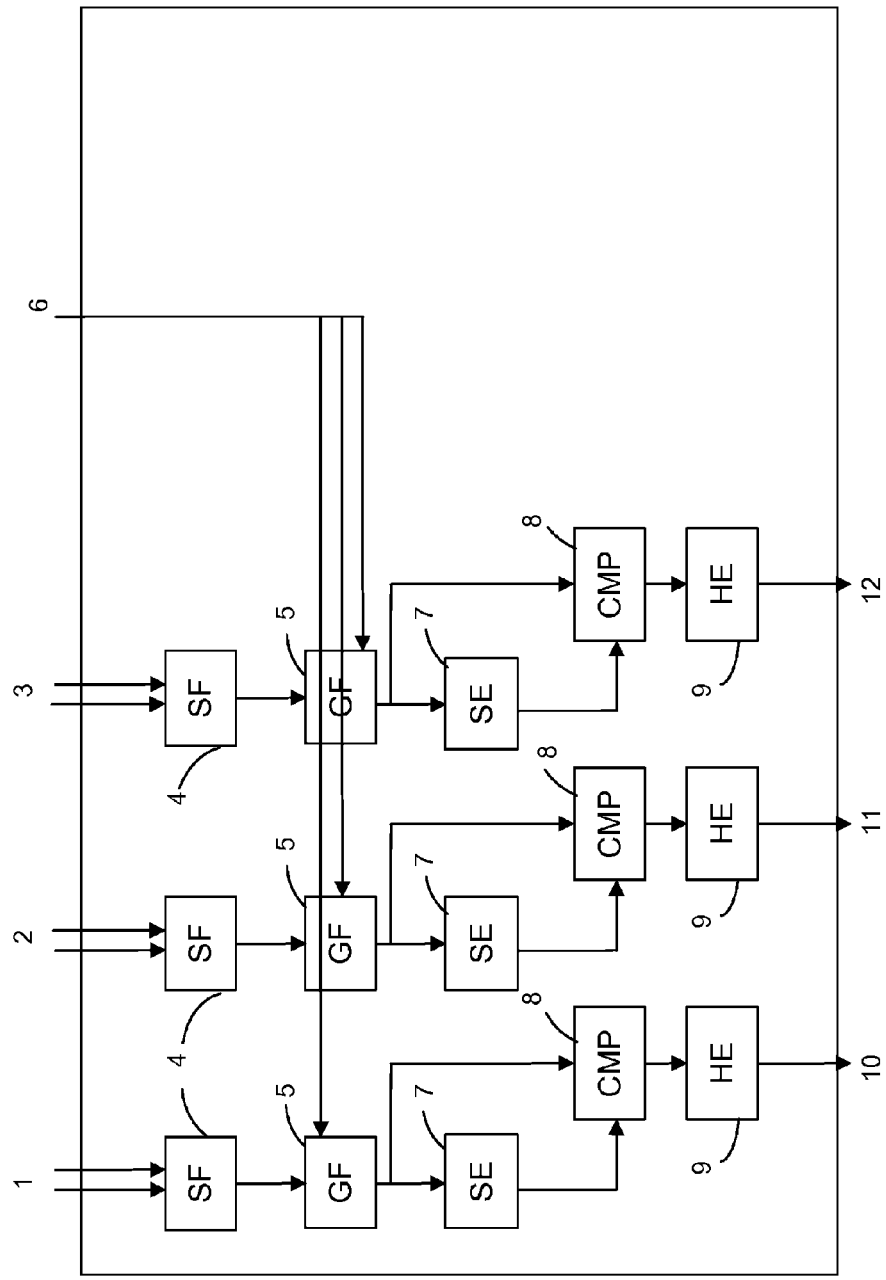
FIG. 1—Represents an overview of an exemplary embodiment of the invention showing the signal flow of groups of I/O pins with static signals to be monitored for the development of errors.

FIG. 1 represents a general overview of an exemplary example of the invention. Here, the static signals to be monitored, coming in to the input/output pins are grouped into three groups 1, 2, and 3 with two signals in each group. Each group is then fed into a separate signal signature circuit 4. As an option, each group of I/O pins to be monitored would be gated, either before or after having their signal signature generated. In FIG. 1, this gating is illustrated in the gating function blocks 5 and controlled by a gating signal 6. This will allow the signals to be switched during non-functional operations such as built-in-self-test (BIST), personalization changes, etc. with the monitoring and error indication circuit being transparent to these operations.

The signal signatures are then each fed into a separate storage element 7. Each signal signature coming into the storage element is compared to the signal signature at the output of the storage element by compare circuits 8. If a signal mismatch occurs as a result of the compare, the mismatch is indicated and held by the mismatch circuits 9. The mismatch circuits 9 may then be interrogated at outputs 10, 11, and 12.

Figure 2:
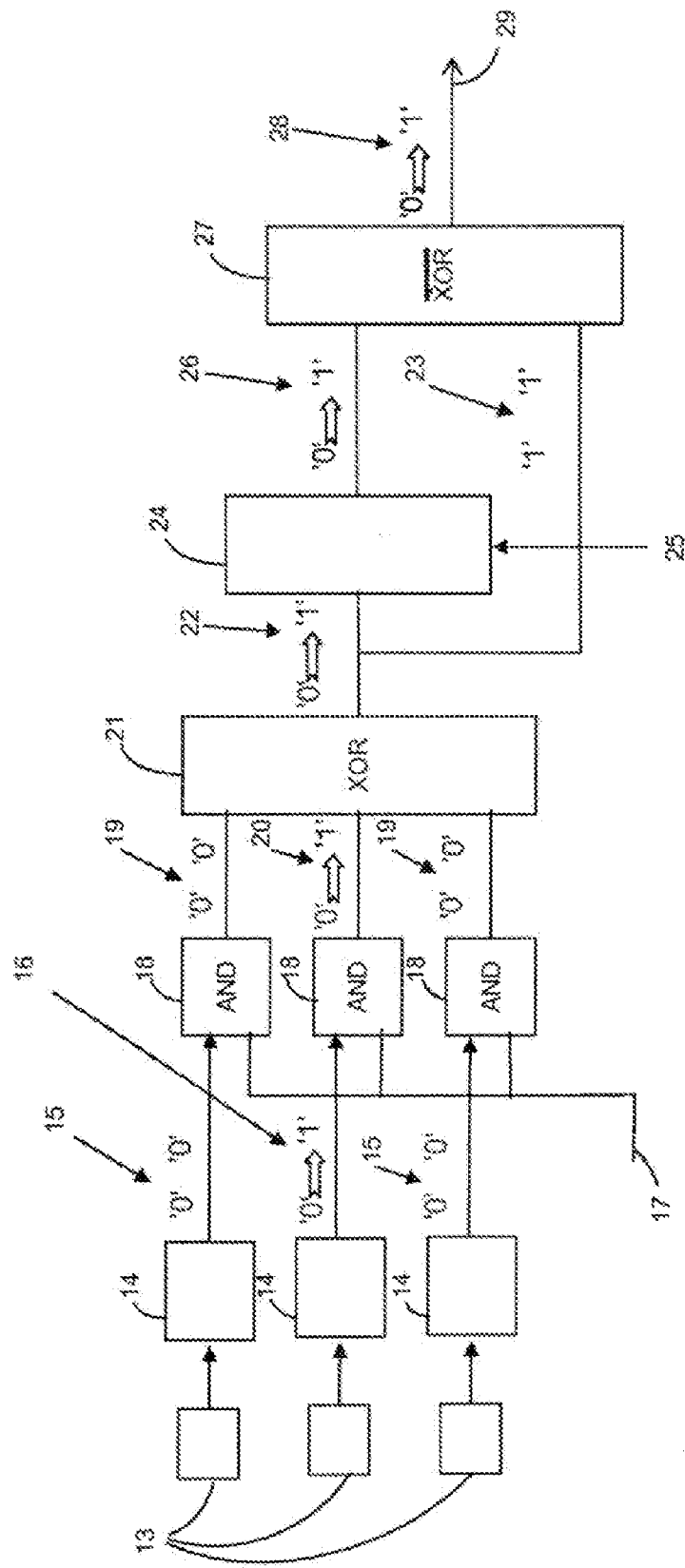
FIG. 2—Represents an exemplary embodiment of a group of I/O pins with static signals with a logic block diagram from the I/O to error capture.

FIG. 2 represents an exemplary embodiment of the implantation of the monitoring and error detection of a group of static signals applied to I/O pins of an integrated circuit. In this example there are three such signals and corresponding I/O pads 13. The signals from each of the pads are fed into three separate receiver circuits 14. The outputs 15 of the first and third receiver circuits 14 are shown to be non-erroneous static signals of a logic zero level for two periods of time. The second receiver output 16 erroneously switches from a logic zero to a logic one over the same two periods of time. These three receiver outputs are fed into separate optional gating AND circuits 18 gated by gate signal 17. The two signals 15 and the one erroneous signal 16 are propagated through the gating circuits 18 into the signal signature circuit, in this example an XOR circuit 21. The output of the XOR circuit 21 is then fed into the input of a storage element 24, such as a latch circuit, which is clocked by a domain clock 25. Then the input signal 22 is clocked an additional clock period to produce output signal 26 and also fed directly into the compare circuit 27 and then this directly fed signal, signal 23 and the output signal 26 of the storage element are compared by compare circuit 27, such as an inverting XOR circuit, to produce error indicator signal 28 which is then fed into a capture circuit through line 29.

Figure 3:
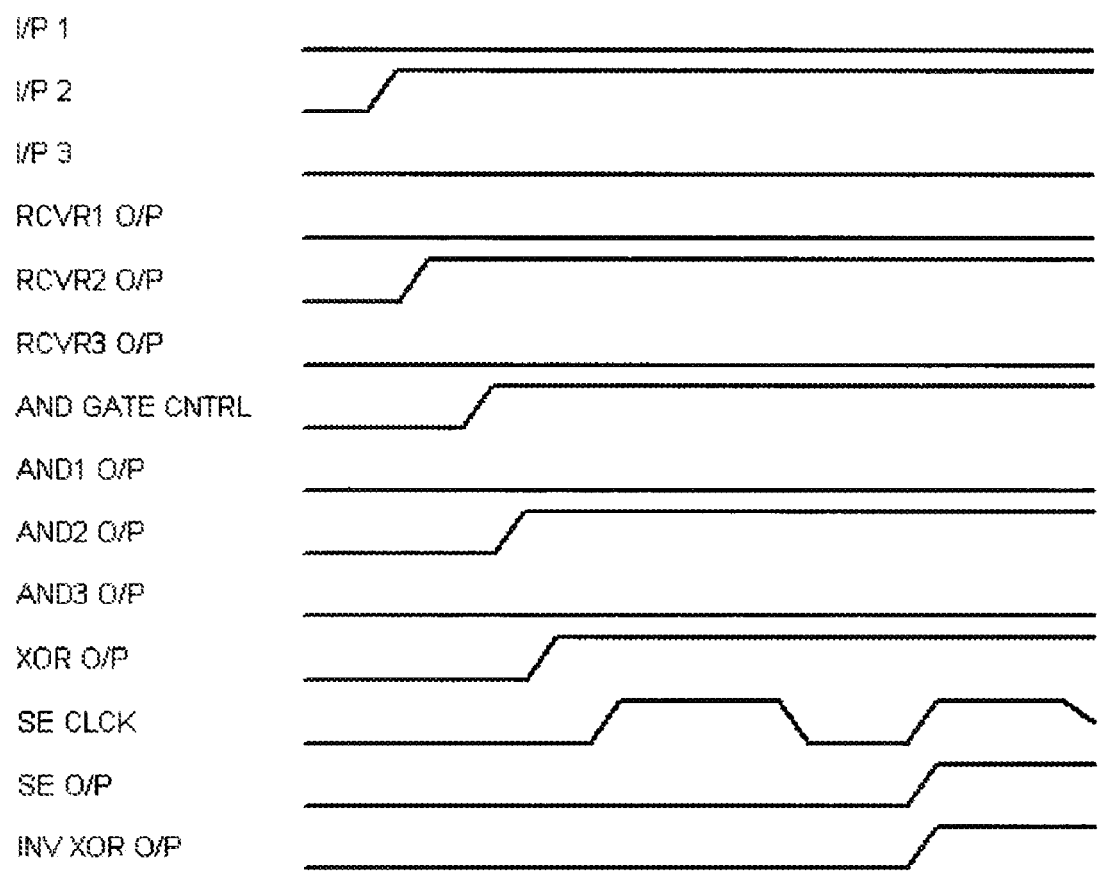
FIG. 3—Represents a timing diagram which illustrates the timing and relative signal levels of the propagation of the signals of FIG. 2.

In FIG. 3, a timing diagram is presented which illustrates the timing and relative signal levels of the propagation of the signals of FIG. 2, from the I/O pads, 13, to the output of the compare circuit, 29.

The circuit arrangement and composition may be different from that exemplified above. For example, the gating function may occur after the signal signature function. Also, the I/O identified above may not only be external I/O but may be internal to the chip. The capture circuit fed by line 29 is not shown as this is typically part of the processor chip circuitry.

The invention claimed is:

1. A method for detecting if a failure occurs on any of one or more static signals applied to IO pins of an integrated circuit, said method comprising:

grouping the signals into one or more groups;
building a signal signature for each of the one or more groups;
feeding each of the signal signatures of the one or more groups into a separate store element comprising an input and an output;
comparing each of the signal signatures for the one or more groups with the output of the store element into which it is fed;

creating a signature mismatch for each of the signal signatures that differs from the output of the store element into which it is fed; and presenting each of the signature mismatches as an error indicator output.

\* \* \* \* \*